(12) United States Patent
Hirakata

(10) Patent No.: US 9,046,245 B2
(45) Date of Patent: Jun. 2, 2015

(54) LIGHTING DEVICE AND LIQUID CRYSTAL DISPLAY DEVICE UTILIZING SELECTIVE REFLECTION STRUCTURE

(75) Inventor: Yoshiharu Hirakata, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 13/401,248

(22) Filed: Feb. 21, 2012

(65) Prior Publication Data

US 2012/0147305 A1 Jun. 14, 2012

Related U.S. Application Data

(62) Division of application No. 11/798,977, filed on May 18, 2007, now abandoned.

(30) Foreign Application Priority Data

Jun. 2, 2006 (JP) .................................. 2006-155470

(51) Int. Cl.
*H05B 33/00* (2006.01)
*H05B 33/22* (2006.01)
*F21V 9/14* (2006.01)
(Continued)

(52) U.S. Cl.
CPC .............. *F21V 9/14* (2013.01); *H01L 51/5012* (2013.01); *H05B 33/22* (2013.01); *G02F 1/133602* (2013.01); *H05B 33/00* (2013.01); *F21Y 2105/006* (2013.01); *G02F 1/133606* (2013.01); *G02F 1/133608* (2013.01); *G02F 1/13362* (2013.01); *G02F 2001/13355* (2013.01)

(58) Field of Classification Search
CPC .... H01L 51/5012; H05B 33/00; H05B 33/22; F21V 9/14; F21Y 2105/006; G02F 1/13362; G02F 2001/13355
USPC ............. 257/98, E33.067, E33.095, E31.095; 349/96
See application file for complete search history.

(56) References Cited

U.S. PATENT DOCUMENTS

| 5,712,694 A | 1/1998 | Taira et al. |
| 5,928,801 A | 7/1999 | Broer et al. |

(Continued)

FOREIGN PATENT DOCUMENTS

| CN | 1165565 | 11/1997 |
| CN | 1482585 | 3/2004 |

(Continued)

OTHER PUBLICATIONS

Korean Office Action (Application No. 2007-0050710;KR09740) Dated Jun. 28, 2013.

(Continued)

*Primary Examiner* — Tom Thomas
*Assistant Examiner* — Christopher M Roland
(74) *Attorney, Agent, or Firm* — Nixon Peabody LLP; Jeffrey L. Costellia

(57) ABSTRACT

A light source includes: a first electrode using a reflective material; an EL layer; and a second electrode using a light-transmitting conductive film, in which light emitted from the EL layer is extracted from the second electrode; a selective reflection structure is provided on a light extraction side of the second electrode without an air layer interposed therebetween; and the selective reflection structure has a function of transmitting light of a particular polarization component and reflecting light of the other component.

2 Claims, 14 Drawing Sheets

(51) Int. Cl.
*H01L 51/50* (2006.01)
*G02F 1/1335* (2006.01)
*F21Y 105/00* (2006.01)

(56) References Cited

U.S. PATENT DOCUMENTS

| | | |
|---|---|---|
| 6,233,029 B1 | 5/2001 | Iijima et al. |
| 6,407,785 B1 | 6/2002 | Yamazaki |
| 6,467,923 B1 | 10/2002 | Umemoto |
| 6,556,260 B1 | 4/2003 | Itou et al. |
| 6,882,400 B2 | 4/2005 | Kobayashi |
| 6,954,239 B2 | 10/2005 | Kato et al. |
| 7,006,171 B1 | 2/2006 | Koden et al. |
| 7,012,365 B2 | 3/2006 | Adachi et al. |
| 7,262,754 B1 | 8/2007 | Yamazaki |
| 7,274,423 B2 | 9/2007 | Kobayashi |
| 7,317,438 B2 | 1/2008 | Yamazaki et al. |
| 7,339,316 B2 | 3/2008 | Adachi et al. |
| 2002/0041348 A1 | 4/2002 | Yokoyama et al. |
| 2002/0093284 A1 | 7/2002 | Adachi et al. |
| 2003/0231394 A1 | 12/2003 | Kimura |
| 2004/0189167 A1 | 9/2004 | Adachi et al. |
| 2004/0227698 A1 | 11/2004 | Yamazaki et al. |
| 2005/0001543 A1 | 1/2005 | Nomura et al. |
| 2005/0035353 A1 | 2/2005 | Adaciii et al. |
| 2005/0127820 A1 | 6/2005 | Yamazaki et al. |
| 2005/0151830 A1 | 7/2005 | Yamazaki et al. |
| 2005/0162355 A1 | 7/2005 | Yamazaki |
| 2005/0194896 A1 | 9/2005 | Sugita et al. |
| 2006/0007540 A1* | 1/2006 | Okuyama ................. 359/497 |
| 2006/0059705 A1 | 3/2006 | Wang et al. |
| 2006/0261337 A1 | 11/2006 | Koma |
| 2007/0085476 A1 | 4/2007 | Hirakata et al. |
| 2007/0258022 A1 | 11/2007 | Takechi et al. |
| 2008/0143253 A1 | 6/2008 | Adachi et al. |

FOREIGN PATENT DOCUMENTS

| | | |
|---|---|---|
| CN | 1627876 | 6/2005 |
| EP | 1 223 618 A2 | 7/2002 |
| EP | 1 309 016 A2 | 5/2003 |
| EP | 1 380 879 A1 | 1/2004 |
| EP | 1731949 A | 12/2006 |
| JP | 02-181302 | 7/1990 |
| JP | 06-349578 | 12/1994 |
| JP | 07-142170 A | 6/1995 |
| JP | 08-087011 | 4/1996 |
| JP | 08-248420 | 9/1996 |
| JP | 09-062196 | 3/1997 |
| JP | 09-127885 | 5/1997 |
| JP | 10-510671 | 10/1998 |
| JP | 11-133231 | 5/1999 |
| JP | 11-231318 | 8/1999 |
| JP | 2000-231105 | 8/2000 |
| JP | 2000-347633 A | 12/2000 |
| JP | 2001-147329 | 5/2001 |
| JP | 2001-357979 | 12/2001 |
| JP | 2002-117972 A | 4/2002 |
| JP | 2003-100444 | 4/2003 |
| JP | 2003-217835 A | 7/2003 |
| JP | 2004-163583 A | 6/2004 |
| JP | 2005-292407 A | 10/2005 |
| KR | 2000-0062934 | 10/2000 |
| KR | 2003-0035960 | 5/2003 |
| WO | WO-97/12276 A1 | 4/1997 |
| WO | WO-2006/034274 | 3/2006 |

OTHER PUBLICATIONS

Office Action (Application No. 200710106533.8;CN09740) Dated May 25, 2010.

Taiwanese Office Action (Application No. 96118416; TW09740) Dated Sep. 11, 2013.

* cited by examiner

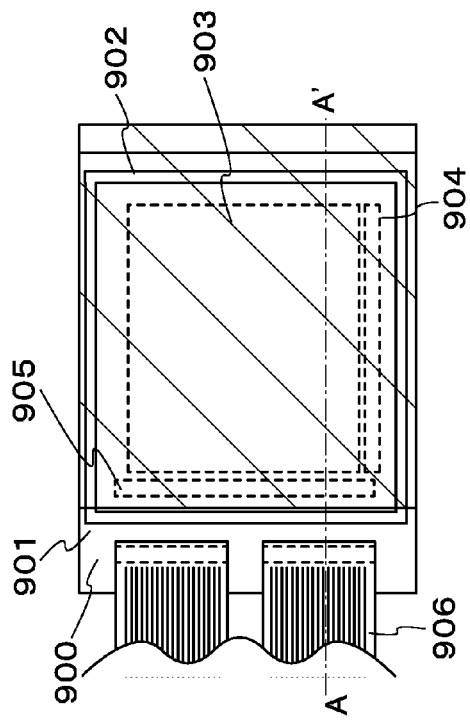
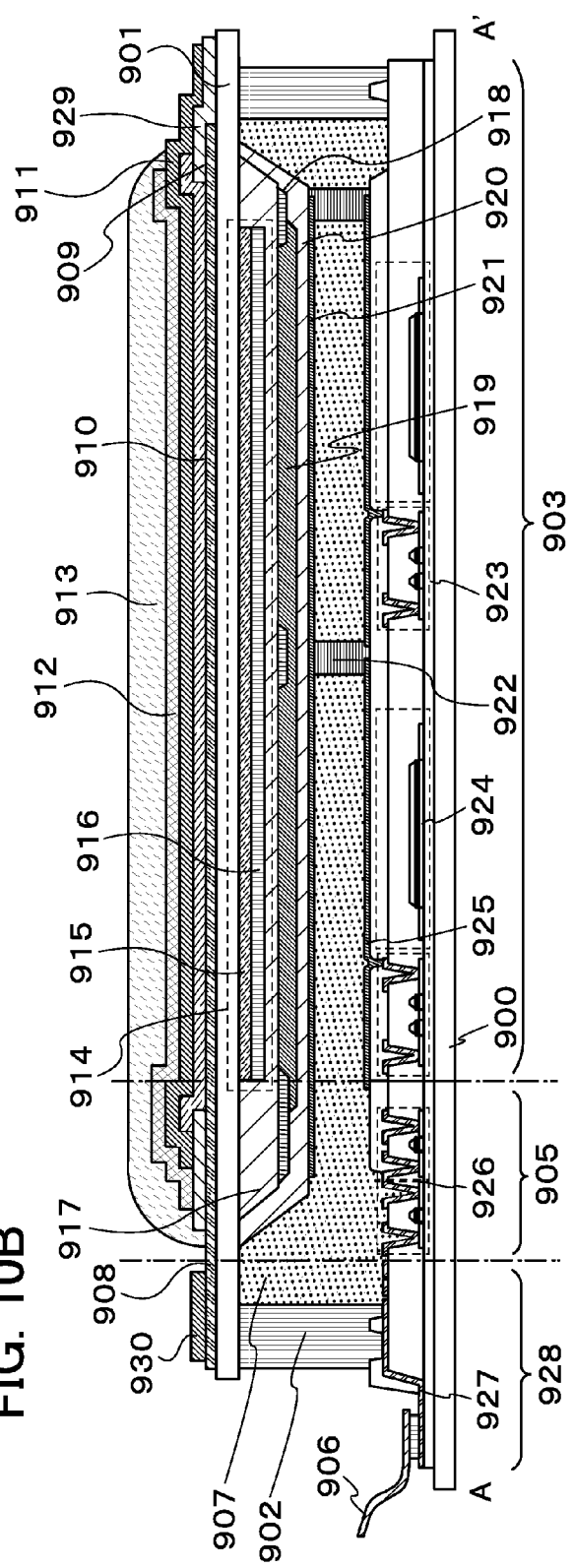
FIG. 10A
FIG. 10B

LIGHTING DEVICE AND LIQUID CRYSTAL DISPLAY DEVICE UTILIZING SELECTIVE REFLECTION STRUCTURE

CROSS-REFERENCE TO RELATED APPLICATIONS

This application is a divisional application of U.S. patent application Ser. No. 11/798,977, filed May 18, 2007 now abandoned, and claims priority to Japanese Patent Application No. 2006-155470, filed Jun. 2, 2006, both of which are herein incorporated by reference in their entirety.

BACKGROUND OF THE INVENTION

1. Field of the Invention

The present invention relates to a lighting device, a liquid crystal element integrally provided with a surface light source, and a liquid crystal display device.

2. Description of the Related Art

Flat panel displays such as liquid crystal panels have been improved, and attempts have been made to improve image quality, reduce power consumption, and improve lifetime. On the other hand, various self-light emitting displays such as PDP (Plasma Display Panel), FED (Field Emission Display), SED (Surface-Conduction Electron-emitter Display), organic electroluminescence (hereinafter referred to as EL) display, and inorganic EL display have been studied, and some of them have been put into practical use. These displays using a self-light emitting display device have been developed for the purpose of breaking into the liquid crystal display market. One feature of these displays is that a thickness of a display portion of a product can be thinned because a backlight is not necessary like liquid crystal, which is advantageous in terms of power consumption.

Even to liquid crystal displays including a wide variety of products from small to large sized products in manufacturing techniques or infrastructures, the entry of the above-described self-light emitting display to a market is a threat, and a problem remaining in a display using a liquid crystal panel requires a response.

The above-described problem of the liquid crystal display includes the following problems: to reduce a space necessary for a backlight and power consumption for driving this backlight; to improve the loss of light other than polarization which needs light polarized as input light to liquid crystal, a cost increase due to a structure such as an optical film for making incident light uniform in the plane, an increase of space; and the like.

In order to solve the above-described problems, downsizing, high efficiency, and longer lifetime of a cold-cathode tube has been continuously developed. Instead of a cold-cathode tube, improvement of luminous efficiency of a light emitting diode has been studied, and improvement thereof has been advanced (e.g., Reference 1: Japanese Published Patent Application No. H8-248420). However, these light sources are a linear light source or a point light source, and a scatter plate having a strong scattering property or a light conducting plate is necessary to obtain uniform luminance.

Furthermore, in order to use light efficiently, there is a liquid crystal display in which multiple kinds of expensive luminance-increasing films are combined, arranged or the like between a light source and the liquid crystal panel. These films can transmit a predetermined polarized light component, the other component can be returned to the light source side, and light thereof can be reflected on the light source side and reused as light incident on the panel again by changing a polarization direction.

SUMMARY OF THE INVENTION

However, these films and a point light source or a linear light source are arranged with an air layer having a large refractive index difference of light interposed therebetween. Therefore, loss such as loss at an interface cannot be overlooked, and further improvement is necessary. In addition, problems of high costs of these films, requiring space installation and the like remain.

An object of the present invention is to provide a lighting device structure which can provide a polarizing function and improve light-use efficiency in the case where a lighting device is used as a light source of a device using a polarization property, specifically, this lighting device is used as a backlight of a liquid crystal panel. Furthermore, another object of the present invention is to provide a structure integrally provided with a light source of a liquid crystal display device using this lighting device.

A structure of a lighting device of the present invention includes a first electrode and a second electrode which face each other, and at least an EL layer provided between the first electrode and the second electrode. The first electrode, the EL layer, and the second electrode are sequentially stacked. Alternatively, the second electrode, the EL layer, and the first electrode are sequentially stacked. In addition, light emitted from the EL layer is extracted from the second electrode.

The first electrode of a light-emitting element is an electrode which can reflect light from a light emitting layer. In addition, the second electrode is an electrode which can transmit light from the light emitting layer.

Furthermore, there is a structure which has a function of selectively transmitting an arbitrary polarization component and reflecting a component of light other than that component in a direction of light which passes through the second electrode (hereinafter, a selective reflection structure). The component of light which has been selectively transmitted herein can be used as incident light on liquid crystal. The light of the component is referred to as effective light here. In addition, reflected light of a component other than the component which has been selectively transmitted is referred to as ineffective light here. In the present invention, ineffective light does not mean light which is not necessary, but means light which can be extracted as effective light by changing a polarization state by reflection or the like.

Here, by reflecting a component of reflected light which is ineffective light between the first electrode having reflectivity and the selective reflection structure provided in the lighting device, a polarization plane or polarization state of this reflected light can be changed. In order to change the polarization state more efficiently, a function of a retardation plate or a function of a scatter plate may be used alone or combined with each other. Thus, the reflected light can be changed into light of the same component as the transmitted light, and this component can also be extracted as effective light.

As a specific example of the selective reflection structure, a reflecting-polarizing plate by a combination of cholesteric liquid crystal and a polarizing film may be used, or a splitting optical device of P-wave polarization and S-wave polarization, such as a polarization beam splitter (hereinafter PBS), may be combined. Although only this structure may be used, more preferably, in addition to the splitting optical device of P-wave polarization and S-wave polarization, a structure having an optical function such as a quarter-wave retardation plate, a scatter plate, or a scattering structure may be used alone or may be combined in order to enhance conversion efficiency and to actively change a polarization plane or polarization state of ineffective light to be reflected. Here, a structure combining them is defined as a selective reflection structure widely.

In emission light from a surface light source in which an EL layer between a first electrode and a second electrode emits light by applying a drive voltage to the first electrode and the second electrode, only a predetermined polarized light component is transmitted and ineffective light of the other component is reflected by forming a selective reflection structure having a selective reflection function of polarization. By using this operation, change of a polarization state or polarization plane with reflection of ineffective light can be caused between this selective reflection structure and a reflection electrode of the lighting device. Thus, light of the lighting device can be efficiently extracted in an arbitrary polarization state on an emission side of the lighting device. Linearly polarized light is usually used.

One feature herein is that loss at an interface between an air layer and a film surface arranged over a selective reflection structure can be reduced because the selective reflection structure and a light source can be arranged without an air layer interposed therebetween. Thus, loss of light can be reduced more than conventional loss, even in the case of multiple reflections between the first electrode which is a reflection electrode and the selective reflection structure.

One mode of a lighting device of the present invention includes: a first electrode using a reflective material; an EL layer; a second electrode using a light-transmitting conductive film; and a selective reflection structure, in which light emitted from the EL layer is extracted from the second electrode; the selective reflection structure is provided on a light extraction side of the second electrode without an air layer interposed therebetween; and the selective reflection structure has a function of transmitting light of a particular polarization component and reflecting the other light.

Another mode of a lighting device of the present invention includes: a substrate; a first electrode; an EL layer; a second electrode; and a selective reflection structure, in which the first electrode, the EL layer, and the second electrode are sequentially stacked over the substrate; the first electrode includes a reflective material; the second electrode includes a light-transmitting material; light emitted from the EL layer is extracted from the second electrode; the selective reflection structure is provided on a light extraction side of the second electrode without an air layer interposed therebetween; and the selective reflection structure has a function of transmitting light of a particular polarization component and reflecting the other light.

Another mode of a lighting device of the present invention includes: a substrate using a light-transmitting material; a second electrode using a light-transmitting material; an EL layer; a first electrode using a reflective material; and a selective reflection structure, in which the second electrode, the EL layer, and the first electrode are sequentially stacked over one side of the substrate; the selective reflection structure is provided over the other side of the substrate; light emitted from the EL layer is extracted from the second electrode; light extracted from the second electrode enters the selective reflection structure through the substrate without an air layer interposed therebetween; and the selective reflection structure has a function of transmitting light of a particular polarization component of entering light and reflecting the other light.

Another mode of a lighting device of the present invention includes: a substrate using a light-transmitting material; a second electrode using a light-transmitting material; an EL layer; a first electrode using a reflective material; an adhesive layer; and a selective reflection structure, in which the second electrode, the EL layer, and the first electrode are sequentially stacked over one side of the substrate; the adhesive layer is provided in contact with the other side of the substrate; the selective reflection structure is provided in contact with the adhesive layer; light emitted from the EL layer is extracted from the second electrode; light extracted from the second electrode enters the selective reflection structure through the substrate and the adhesive layer; and the selective reflection structure has a function of transmitting light of a particular polarization component of entering light and reflecting the other light.

One mode of a liquid crystal display device of the present invention includes: a liquid crystal provided between a first substrate and a second substrate; a pixel electrode using a light-transmitting conductive film; and a semiconductor element connected to the pixel electrode, and the pixel electrode and the semiconductor element are formed over the first substrate; the first substrate is a light-transmitting and insulating substrate; the second substrate is provided with a first electrode using a reflective material, an EL layer, a second electrode using a light-transmitting conductive film; and a selective reflection structure; light emitted from the EL layer is extracted from the second electrode; and the selective reflection structure is provided on a light extraction side of the second electrode without an air layer interposed therebetween.

Another mode of a liquid crystal display device of the present invention includes: a liquid crystal provided between a first substrate and a second substrate; a pixel electrode using a light-transmitting conductive film; and a semiconductor element connected to the pixel electrode, and the pixel electrode and the semiconductor element are formed over the first substrate; the first substrate is a light-transmitting and insulating substrate; the second substrate is provided with a selective reflection structure on a surface facing the pixel electrode; a second electrode using a light-transmitting conductive film, an EL layer, and a first electrode using a reflective material are sequentially stacked over a back side of the second substrate; and the second substrate is a light-transmitting and insulating substrate.

Another mode of a liquid crystal display device of the present invention includes: a liquid crystal provided between a first substrate and a second substrate; a pixel electrode using a light-transmitting conductive film; a semiconductor element connected to the pixel electrode; and a selective reflection structure, and the pixel electrode and the semiconductor element are formed over the first substrate; the first substrate is a light-transmitting and insulating substrate; the second substrate is provided with an adhesive layer in contact with a surface facing the pixel electrode; the selective reflection structure is provided in contact with the adhesive layer; a second electrode using a light-transmitting conductive film, an EL layer, and a first electrode using a reflective material are sequentially stacked over a back side of the second substrate; and the second substrate is a light-transmitting and insulating substrate.

In the above structure, the selective reflection structure may include an optical structure combined with a function of a polarization beam splitter which is formed to transmit a P-wave and reflect an S-wave to the first electrode side. In addition, the selective reflection structure may include a retardation plate transmitting a circular polarization component having a particular rotation direction of light which enters and converting transmitted light of the circular polarization component into linear polarization; and a reflective polarizing function which is formed to reflect light of the other component to the first electrode side.

Here, in the light-emitting element of the present invention, the EL layer provided between the first electrode and the second electrode may have at least one light emitting layer. The EL layer may be provided with plural light emitting layers.

In addition, a light-emitting element in which a layer such as an electron injecting layer, an electron transporting layer, a hole blocking layer, a hole transporting layer, or a hole injecting layer besides the light emitting layer is formed as appropriate can also be included in the scope of the present invention.

In addition, the EL layer of the present invention may be an EL layer in which an inorganic light-emitting material is dispersed in a binder or an EL layer formed as a thin film. Further, a light-emitting element provided with one or more dielectric layers as well as a light emitting layer may be included in the scope of the present invention.

As an effect of the present invention, by using a surface light source, particularly, a scattering optical system or the like is not necessary, and emission light having less luminance variation can be used. In addition, since light can be emitted from a plane, the surface light source can be disposed on a parallel plane at a distance very dose to the selective reflection structure, and a structure integrally provided with a light source without including an air layer can be formed. Therefore, refractive index difference can be reduced, and a structure having less loss at the interface can be formed. With these features, an operation in which ineffective light reflected can also be converted and extracted as well as a single polarization component is realized; accordingly, a polarizing light source having higher light-use efficiency can be formed.

Furthermore, one substrate can be provided with these functions; therefore, the substrate can be used not only as a light source of a backlight of liquid crystal but also as a counter substrate of the liquid crystal directly, and a liquid crystal panel incorporating a backlight can be realized.

With these effects, a thin liquid crystal panel with low power consumption can be realized.

BRIEF DESCRIPTION OF THE DRAWINGS

FIGS. 10A and 10B are diagrams illustrating a liquid crystal display device of the present invention.

DETAILED DESCRIPTION OF THE INVENTION

Hereinafter, embodiment modes of the present invention will be described with reference to the accompanying drawings. However, the present invention can be implemented in various modes. For example, embodiment modes can be combined as appropriate. As is easily known to a person skilled in the art, the mode and the detail of the present invention can be variously changed without departing from the spirit and the scope of the present invention. Thus, the present invention should not be interpreted as being limited to the following description of the embodiment modes.

Embodiment Mode 1

Figure 1:
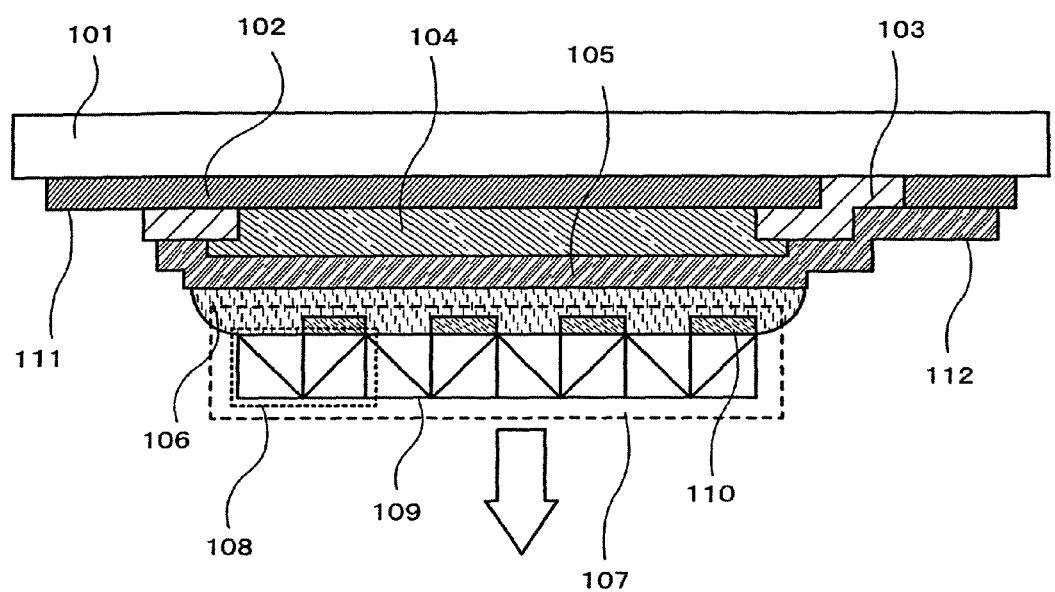
FIG. 1 is a diagram illustrating a lighting device of the present invention.

FIG. 1 shows a cross-sectional view of a lighting device provided with a polarization function of this embodiment mode. One side of a substrate 101 is provided with a first electrode 102 using a reflective material and an insulating layer 103 which is provided after the first electrode is formed, and an EL layer 104 is provided in a light emitting region on the first electrode. A second electrode 105 using a light-transmitting (conductive film) material is provided over the EL layer to serve as the light emitting region. Furthermore, a selective reflection structure 107 is provided with an adhesive layer 106 interposed between the second electrode 105 and the selective reflection structure 107.

In this structure, a lead-out portion 111 of the first electrode and a lead-out portion 112 of the second electrode are formed over the one side of the substrate 101.

Here, this selective reflection structure 107 is formed using an aggregate (hereinafter a PBS array) 109 of PBS blocks 108 each including two PBSs in which optical function surfaces (hereinafter, optical axial planes) thereof are arranged at an angle of 90°.

An S-wave component (hereinafter, an S-wave) of light entering from a light source is reflected between these two PBS blocks 108, and reflected light of the S-wave is returned to the light source side. At this time, a P-wave component (hereinafter, a P-wave) passes through this optical function surface to serve as emission light of the light source.

Further, as a component of the selective reflection structure 107, an example is shown here, in which quarter-wave retardation plates (hereinafter, quarter-wave plates) 110 are arranged at predetermined positions. An S-wave reflected light which is reflected and returned to the light source side by the PBS blocks 108 is converted into light of a circular polarization component or light of an elliptical polarization component having a rotating direction by passing through the quarter-wave plate 110. When this returned reflected light of circular polarization or elliptical polarization is reflected again at a reflection surface of the first electrode, and when this returned reflected light of circular polarization or elliptical polarization enters the quarter-wave plate again, another quarter-wave phase difference is given; therefore, the returned reflected light of circular polarization or elliptical polarization can be converted into light of a P-wave component or light of a large amount of a P-wave component and pass through the PBS blocks. In the present invention, light which is reflected and of which a light direction is changed in the selective reflection structure is referred to as reflected light.

Figure 2:
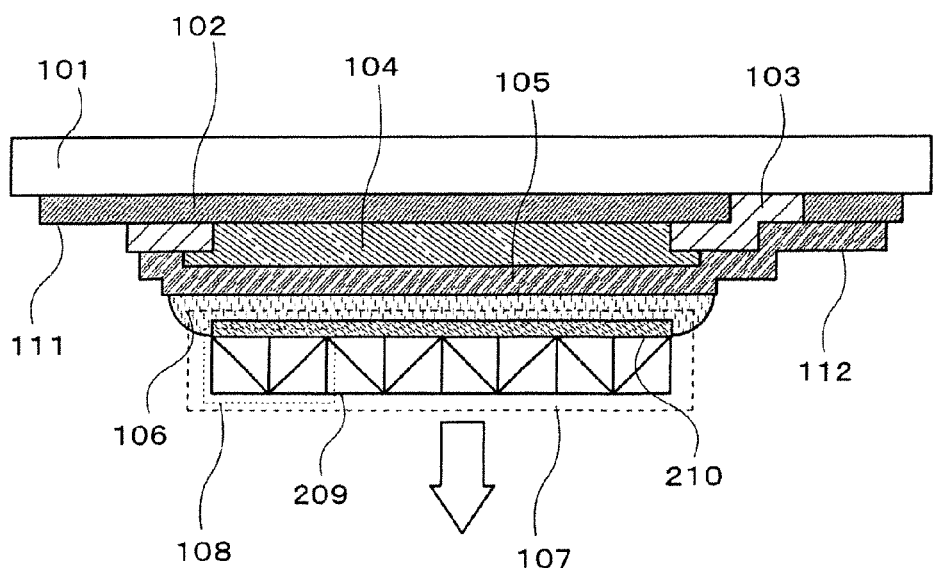
FIG. 2 is a diagram illustrating a lighting device of the present invention.

That is, the quarter-wave plate 110 of this embodiment mode is provided in order to change a polarization state most efficiently. In this example, the quarter-wave plate 110 is formed only on one side of one of the PBSs included in the PBS block 108; however, the quarter-wave plate 110 may be formed over the entire surface of a PBS array 209, like a quarter-wave plate 210 shown in FIG. 2. Needless to say, improvement can be expected compared with a conventional light source even when the quarter-wave plate 110 is not provided to reduce structural cost.

In this embodiment mode, the selective reflection structure 107 is described using the PBS block 108 each including two PBSs in which optical function surfaces (hereinafter, optical axial planes) thereof are arranged at an angle of 90°. However, an object is to transmit an effective light component, to reflect and return ineffective light to the light source side; therefore, this angle is not limited to 90°. For example, this angle may be 60° or 140° as long as the object can be achieved.

As an effect of this embodiment mode, by using a surface light source, particularly, a scattering optical system or the like is not necessary, and emission light having less luminance variation can be used. In addition, since light can be emitted from a plane, the surface light source can be disposed on a parallel plane at a distance very close to the selective reflection structure, and a structure integrally provided with a light source without including an air layer can be formed. Therefore, refractive index difference can be reduced, and a structure having less loss at the interface can be formed. With these features, an operation in which ineffective light reflected can also be converted and extracted as well as a single polarization component is realized; accordingly, a polarizing light source having higher light-use efficiency can be formed.

Furthermore, one substrate can be provided with these functions; therefore, the substrate can be used not only as a light source of a backlight of liquid crystal but also as a counter substrate of the liquid crystal directly, and a liquid crystal panel incorporating a backlight can be realized.

With these effects, a thin liquid crystal panel with low power consumption can be realized.

Embodiment Mode 2

Figure 3:
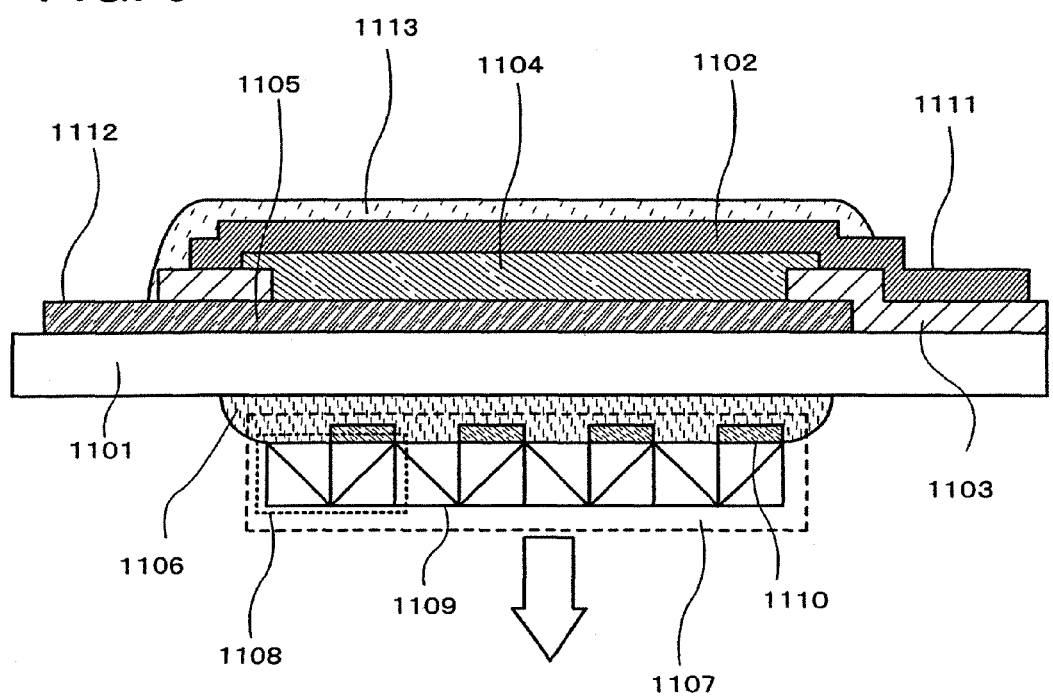
FIG. 3 is a diagram illustrating a lighting device of the present invention.

FIG. 3 shows a cross-sectional view of a lighting device provided with a polarization function of this embodiment mode. One side of a substrate is provided with a light source structure, and the other side of the substrate is provided with a selective reflection structure. This structure is referred to as a double-sided structure here.

On one side of a substrate 1101, a second electrode 1105 using a light-transmitting material is provided, an insulating layer 1103 is provided after this second electrode is formed, and an EL layer 1104 is provided in a light emitting region over the second electrode. A first electrode 1102 using a reflective material is provided over the EL layer 1104 to serve as the light emitting region. Furthermore, a protective film 1113 is provided over this first electrode 1102.

In addition, the other side of the substrate is provided with a selective reflection structure 1107, with an adhesive layer 1106 interposed therebetween, at a position approximately corresponding to a region where light is emitted from the second electrode.

A feature of this structure is that a lead-out portion 1111 of the first electrode and a lead-out portion 1112 of the second electrode are provided on a side opposite to an emission side of light from the selective reflection structure.

Description is omitted here because an optical function from a light source is similar to that in Embodiment Mode 1 except that a glass substrate is sandwiched between a light source and a selective reflection structure.

Figure 4:
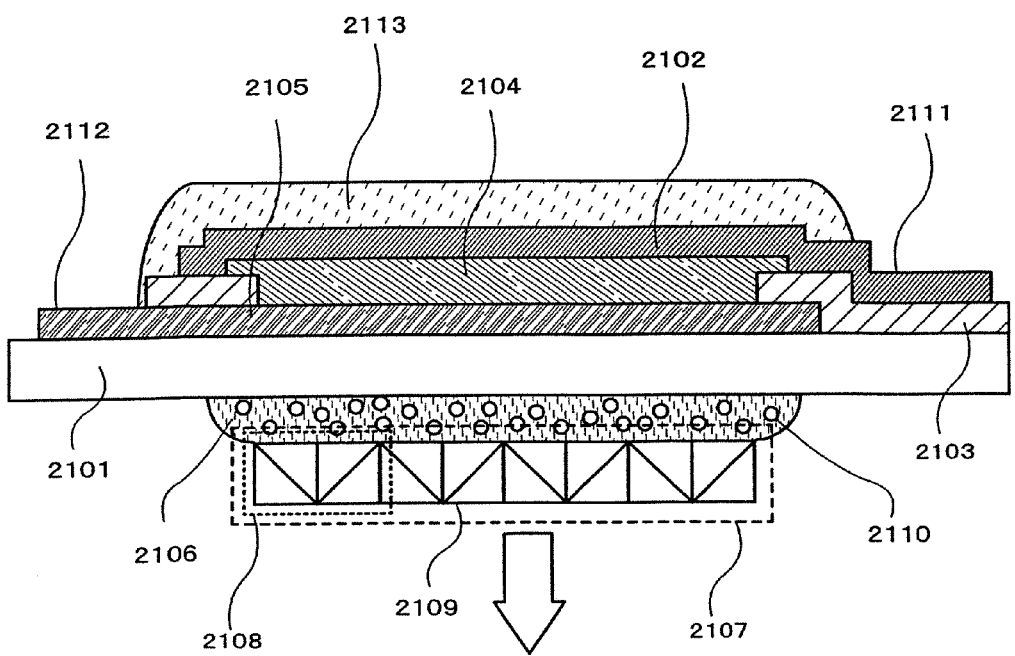
FIG. 4 is a diagram illustrating a lighting device of the present invention.

A quarter-wave plate 1110 of this embodiment mode is provided in order to change a polarization state most efficiently. In this example, the quarter-wave plate 1110 is formed only on one side of one of two PBSs included in a PBS block 1108; however, FIG. 4 shows an example in which a quarter-wave plate is omitted in the double-sided structure in Embodiment Mode 2.

In this embodiment mode, when scatterers 2110 are dispersed in an adhesive layer 2106 as a scattering layer, by using not a property in which a polarization state is changed but an effect in which a polarization plane is mainly changed intentionally, light emitted from the light source is scattered, and luminance uniformity is improved further, as well as extraction efficiency being improved. In terms of extraction efficiency of emitted-light, the lighting device shown in FIG. 4 is inferior to a lighting device having the quarter-wave plate 1110; however, the lighting device shown in FIG. 4 has advantages in that the lighting device can have a simple structure in terms of manufacturing and cost can be reduced.

As an effect of this embodiment mode, by using a surface light source, particularly, a scattering optical system or the like is not necessary, and emission light having less luminance variation can be used. In addition, since light can be emitted from a plane, the surface light source can be disposed on a parallel plane at a distance very close to the selective reflection structure, and a structure integrally provided with a light source without including an air layer can be formed. Therefore, refractive index difference can be reduced, and a structure having less loss at the interface can be formed. With these features, an operation in which ineffective light reflected can also be converted and extracted as well as a single polarization component is realized; accordingly, a polarizing light source having higher light-use efficiency can be formed.

Furthermore, one substrate can be provided with these functions; therefore the substrate can be used not only as a light source of a backlight of liquid crystal but also as a counter substrate of the liquid crystal directly, and a liquid crystal panel incorporating a backlight can be realized.

With these effects, a thin liquid crystal panel with low power consumption can be realized.

Embodiment Mode 3

Figure 5:
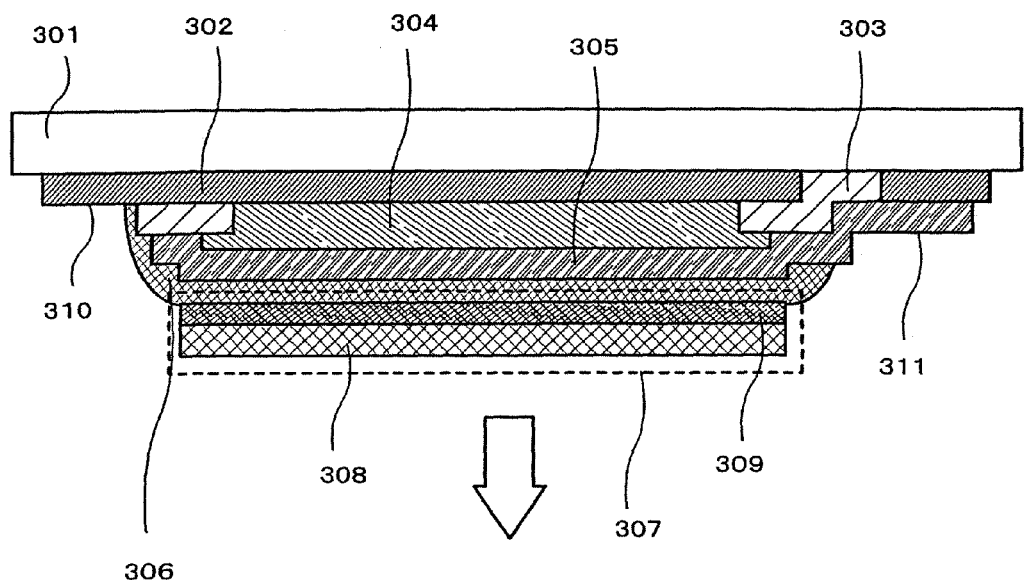
FIG. 5 is a diagram illustrating a lighting device of the present invention.

FIG. 5 shows a cross-sectional view of a lighting device provided with a polarization function of this embodiment mode. One side of a substrate 301 is provided with a first electrode 302 using a reflective material and an insulating layer 303 which is provided after this first electrode is formed, and an EL layer 304 is provided in a light emitting region over the first electrode. The EL layer to serve as the light emitting region is provided with a second electrode 305 using a light-transmitting (conductive film) material. Furthermore, a selective reflection structure 307 is provided with a passivation layer 306 interposed between the second electrode 305 and the selective reflection structure 307.

In this structure, a lead-out portion 310 of the first electrode and a lead-out portion 311 of the second electrode are formed over the one side of the substrate 301.

Here, this selective reflection structure 307 transmits only a predetermined circular polarization component, and this transmitted light component is converted into linear polarization by stacked retardation plates, and is outputted. In addition, this selective reflection structure 307 has an operation of reflecting light of the other component.

Further, as a component of the selective reflection structure 307, an example is shown here, in which a quarter-wave plate 309 is provided at a predetermined position. By passing through the quarter-wave plate 309, a polarization state of light which passes through this optical film is changed. Light which enters a reflection polarization plate 308 can be polarization-converted at the time of passing through the quarter-wave plate 309, first. Of the incident light which has been polarization-converted, only a predetermined circular polarization component is transmitted through the reflection polarization plate 308, converted into linear polarization by the polarization plate, and outputted as effective light.

In addition, ineffective light reflected by the reflection polarization plate 308 is polarization-converted and returned to a light source direction, by passing through the quarter-wave plate 309 again. This ineffective light is reflected by the first electrode of the light source, and serves as incident light on the selective reflection structure again. Here, this ineffective light is polarization-converted by the quarter-wave plate 309 again, and a predetermined circular polarization component thereof is emitted as effective light.

Figure 6:
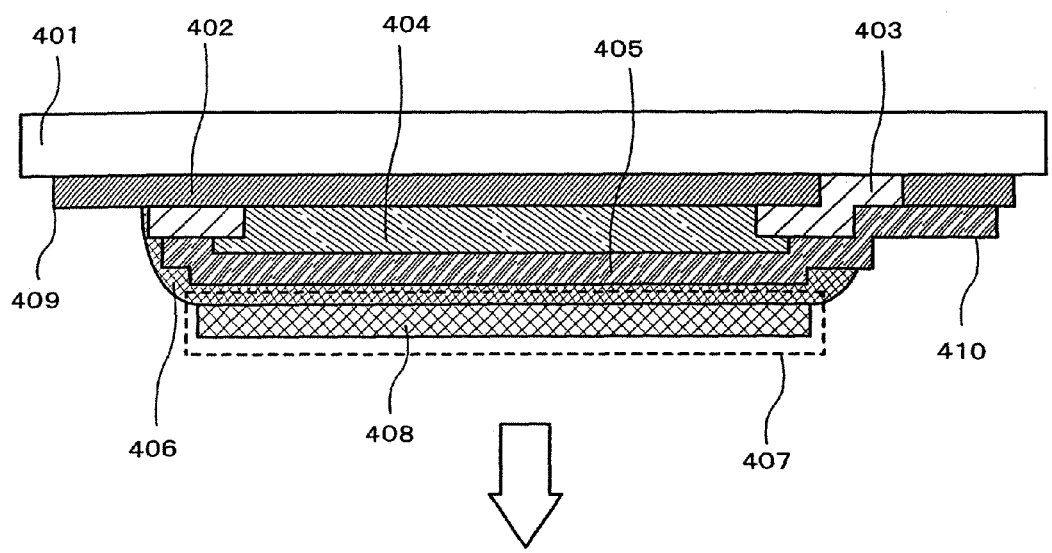
FIG. 6 is a diagram illustrating a lighting device of the present invention.

Although the quarter-wave plate 309 of this example is provided in order to change a polarization state more efficiently, FIG. 6 shows an example which does not use a quarter-wave plate to give priority on manufacturing cost. One side of a substrate 401 is provided with a first electrode 402 using a reflective material and an insulating layer 403 which is provided after this first electrode is formed, and an EL layer 404 is provided in a light emitting region over the first electrode 401. The EL layer to serve as the light emitting region is provided with a second electrode 405 using a light-transmitting (conductive film) material. Furthermore, a selective reflection structure 407 including a reflection polarization plate 408 is provided with a passivation layer 406 interposed between the second electrode 405 and the selective reflection structure 407. In this structure, a lead-out portion 409 of the first electrode and a lead-out portion 410 of the second electrode are formed over the one side of the substrate 401. Although efficiency is sacrificed in some degree, improvement can be expected compared with a conventional light source.

As an effect of this embodiment mode, by using a surface light source, particularly, a scattering optical system or the like is not necessary, and emission light having less luminance variation can be used. In addition, since light can be emitted from a plane, the surface light source can be disposed on a parallel plane at a distance very close to the selective reflection structure, and a structure integrally provided with a light source without including an air layer can be formed. Therefore, refractive index difference can be reduced, and a structure having less loss at the interface can be formed. With these features, an operation in which ineffective light reflected can also be converted and extracted as well as a single polarization component is realized; accordingly, a polarizing light source having higher light-use efficiency can be formed.

Furthermore, one substrate can be provided with these functions; therefore, the substrate can be used not only as a light source of a backlight of liquid crystal but also as a counter substrate of the liquid crystal directly, and a liquid crystal panel incorporating a backlight can be realized.

With these effects, a thin liquid crystal panel with low power consumption can be realized.

Embodiment Mode 4

Figure 7:
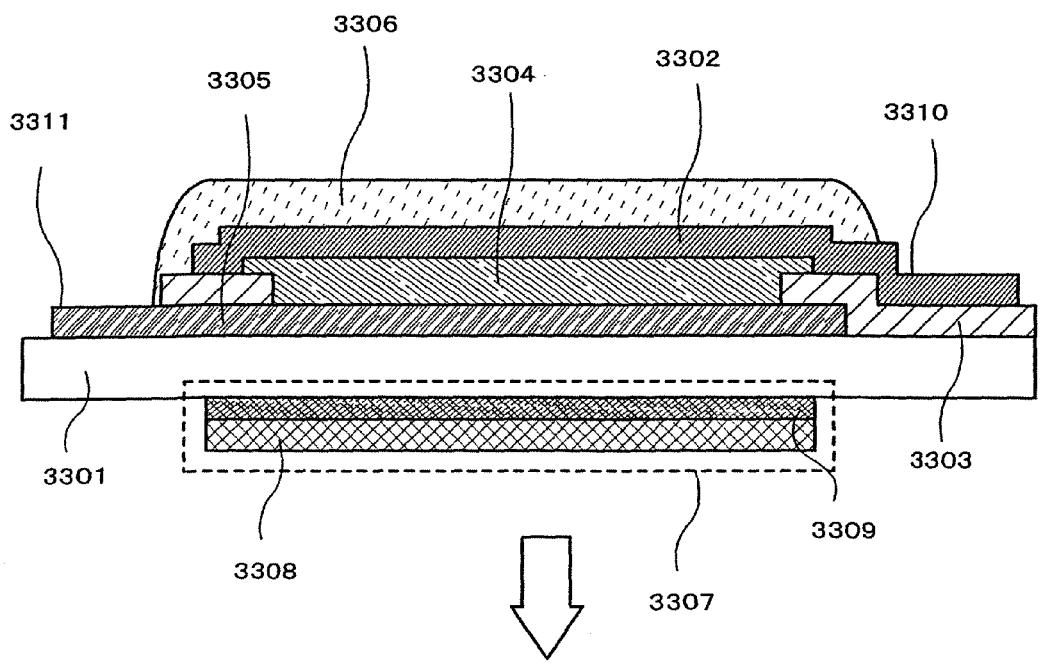
FIG. 7 is a diagram illustrating a lighting device of the present invention.

FIG. 7 shows a cross-sectional view of a lighting device provided with a polarization function of this embodiment mode. Another example of a double-sided structure is shown, in which one side of a substrate is provided with a light source structure and the other side of the substrate is provided with a selective reflection structure.

On one side of a substrate 3301, a second electrode 3305 using a light-transmitting material is provided and an insulating layer 3303 is provided after this second electrode is formed, and an EL layer 3304 is provided in a light emitting region over the second electrode. A first electrode 3302 using a reflective material is provided over the EL layer 3304 to serve as the light emitting region. Furthermore, a protective film 3306 is provided over this first electrode 3302.

In addition, the other side of the substrate is provided with a selective reflection structure 3307 at a position approximately corresponding to a region where light is emitted from the second electrode.

A feature of this structure is that a lead-out portion 3310 of the first electrode and a lead-out portion 3311 of the second electrode are provided on a side opposite to an emission side of light from the selective reflection structure 3307.

Description is omitted here because an optical function from a light source is similar to that in Embodiment Mode 3 except that a glass substrate is sandwiched between a light source and a selective reflection structure.

The selective reflection structure 3307 of this embodiment mode includes a quarter-wave plate 3309 and a reflection polarization plate 3308 in order to change a polarization state efficiently. Although optical thin films are formed on the substrate directly, they may be formed using a member made of a film including an adhesive layer.

Figure 8:
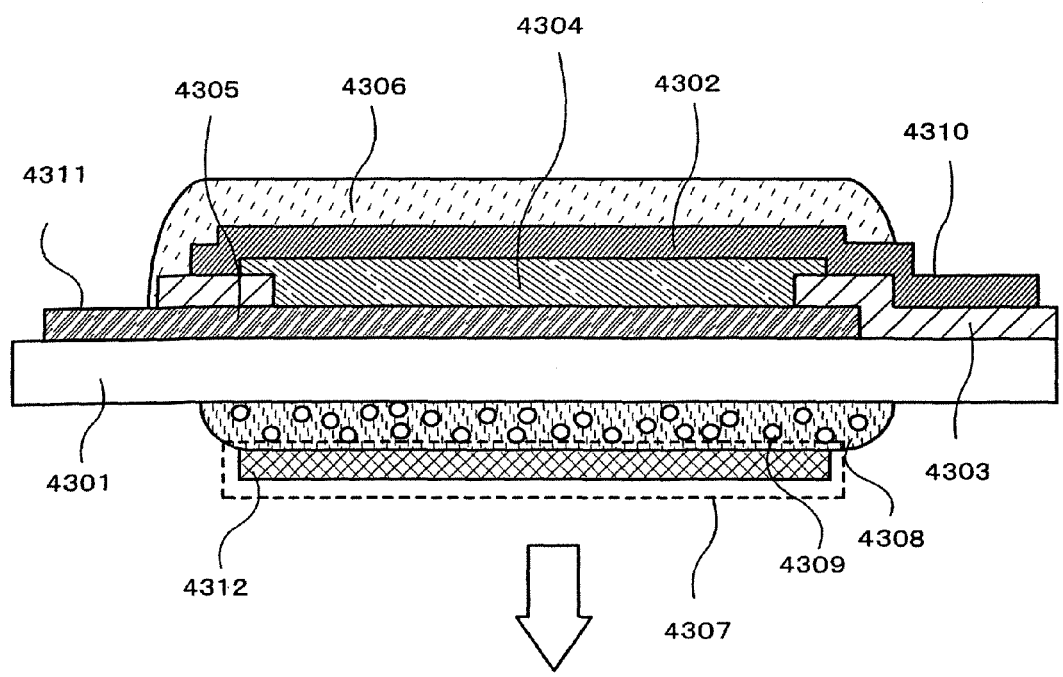
FIG. 8 is a diagram illustrating a lighting device of the present invention.

Here, FIG. 8 shows an example in which a quarter-wave plate is omitted and a scattering layer is used in the double-sided structure in Embodiment Mode 3. The selective reflection structure 4307 includes a reflection polarization plate 4312.

In this embodiment mode, when scatterers 4309 are dispersed in an adhesive layer 4308 as a scattering layer, by using not a property in which a polarization state is changed but an effect in which a polarization plane is mainly changed intentionally, light emitted from the light source is scattered, and luminance uniformity is improved further as well as extraction efficiency being improved. The lighting device shown in FIG. 8 has advantages in that this structure can be simple in terms of manufacturing and cost can be reduced.

As an effect of this embodiment mode, by using a surface light source, particularly, a scattering optical system or the like is not necessary, and emission light having less luminance variation can be used. In addition, since light can be emitted from a plane, the surface light source can be disposed on a parallel plane at a distance very close to the selective reflection structure, and a structure integrally provided with a light source without including an air layer can be formed. Therefore, refractive index difference can be reduced, and a structure having less loss at the interface can be formed. With these features, an operation in which ineffective light reflected can also be converted and extracted as well as a single polarization component is realized; accordingly, a polarizing light source having higher light-use efficiency can be formed.

Furthermore, one substrate can be provided with these functions; therefore, the substrate can be used not only as a light source of a backlight of liquid crystal but also as a counter substrate of the liquid crystal directly, and a liquid crystal panel incorporating a backlight can be realized.

With these effects, a thin liquid crystal panel with low power consumption can be realized.

Embodiment Mode 5

Figure 9A:
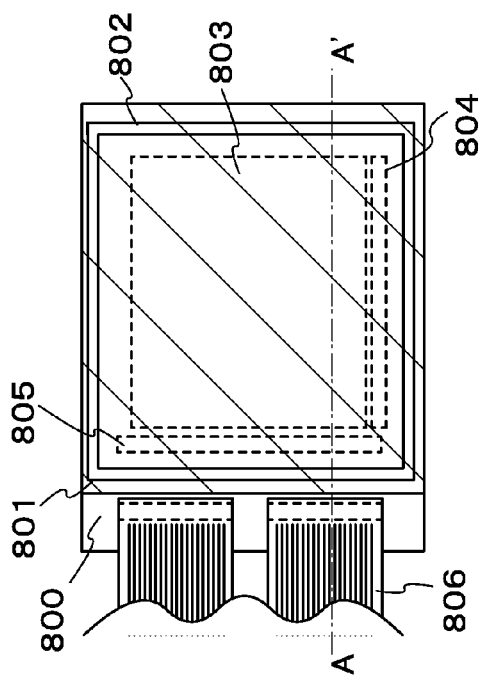
FIGS. 9A and 9B are diagrams illustrating a liquid crystal display device of the present invention.
Figure 9B:
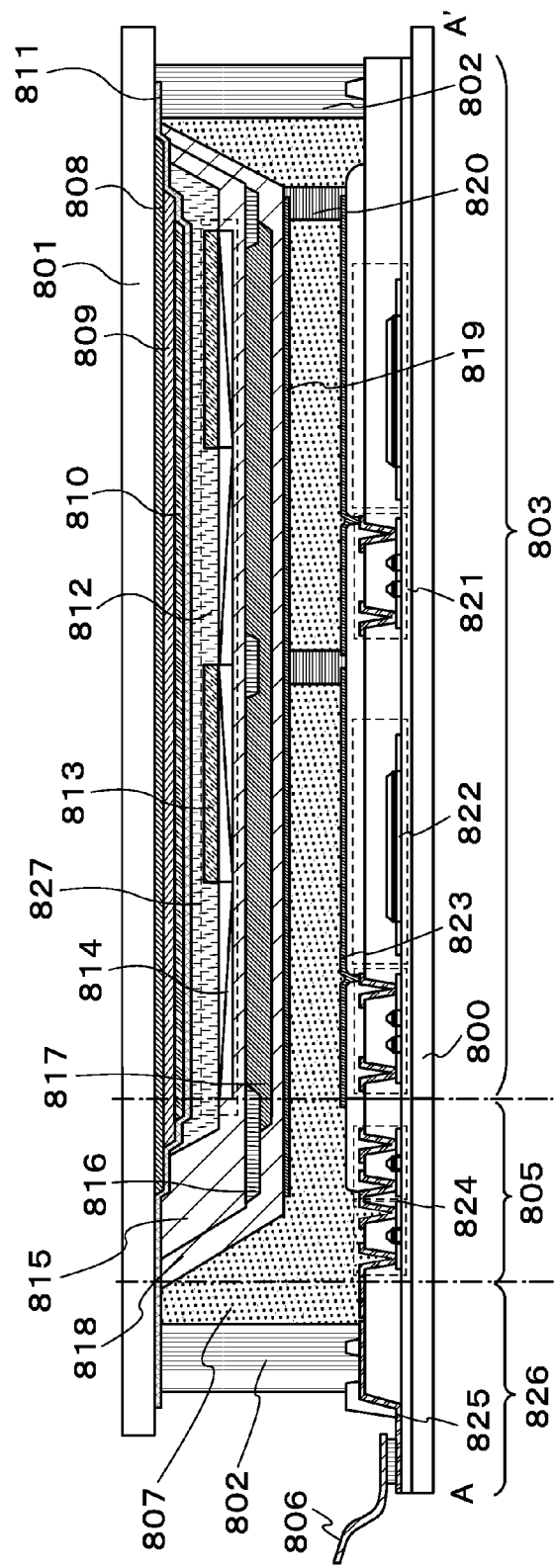

This embodiment mode will describe an example in which the present invention is used for an active matrix liquid crystal panel having a display function, with reference to FIGS. 9A and 9B.

FIG. 9A is a schematic view of an active matrix liquid crystal panel when seen from the top. A counter substrate 801 is firmly fixed to an element substrate 800 with a sealant 802.

The element substrate 800 is provided with a pixel portion 803, a gate driver circuit 804, and a source driver circuit 805. Each of the gate driver circuit 804 and the source driver circuit 805 is connected to an FPC (Flexible Printed Circuit) 806 which is an external input terminal, through a wiring group. The source driver line 805 and the gate driver line 804 each receive a video signal, a clock signal, a start signal, a reset signal, various power supplies, or the like from the FPC 806.

Transistors in the pixel portion 803, the gate driver circuit 804, and the source driver circuit 805 are thin film transistors (hereinafter, TFTs). Note that the gate driver circuit 804 and the source driver circuit 805 are not necessarily provided over the same element substrate 800 as the pixel portion 803, as in the example described above. For example, the gate driver circuit 804 and the source driver circuit 805 may be provided outside the substrate by using a TCP in which an IC chip is mounted on an FPC on which a wiring pattern is formed, or the like. In addition, a part of circuits in each of the gate driver circuit 804 and the source driver circuit 805 may be provided over the element substrate 800, and another part of them may be provided outside the element substrate 800.

FIG. 9B shows a cross-sectional view along a line A-A' of FIG. 9A. This counter substrate 801 is provided with a light source having a polarization function of the present invention, and a light-emission surface of effective light from this counter substrate and an element surface of the element substrate 800 are arranged so as to face each other while a predetermined space (hereinafter, a cell gap) is kept. Liquid crystal 807 is oriented inside the sealant 802 which firmly fixes these substrates (the element substrate 800 and the counter substrate 801), and a panel provided with a light source is formed.

Although not shown here, orientation films which are subjected to orientation treatment are formed on surfaces having an opposite electrode 819 and a pixel electrode 823. In addition, a spacer 820 is formed over the element substrate in order to keep the cell gap here. Although not shown, a spacer material, called a filler may be mixed into the sealant 802. In this structure, light is extracted from the element substrate 800 side.

Here, a first electrode 808 using a reflective material, an EL layer 809 to serve as a light-emitting portion, and a second electrode 810 using a light-transmitting conductive material are sequentially stacked over the counter substrate 801. Although not shown in this cross-sectional view, in the case where the first electrode and the second electrode may be electrically short-circuited, an insulating layer may be provided in a region except a light-emitting area and a power supply connection portion to avoid short-circuit.

Next the second electrode 810 is provided with a passivation layer 811 for the purpose of preventing adverse effect caused by moisture or oxygen on the EL layer here.

As a reflective material, a conductive film made of titanium, tungsten, nickel, gold, platinum, silver, aluminum, magnesium, calcium, lithium, an alloy thereof, or the like can be used.

As a light-transmitting conductive material, indium tin oxide (ITO), indium zinc oxide (IZO) in which zinc oxide (ZnO) is mixed in indium oxide, a conductive material in which silicon oxide ($SiO_2$) is mixed in indium oxide, organic indium, organotin, indium oxide containing tungsten oxide, indium zinc oxide containing tungsten oxide, indium oxide containing titanium oxide, indium tin oxide containing titanium oxide, or the like can be used.

A planarizing film can be formed using a material of silicon oxide, silicon nitride, silicon oxynitride, silicon nitride oxide, aluminum nitride (AlN), aluminum oxide containing nitrogen (also referred to as aluminum oxynitride) (AlON), aluminum nitride containing oxygen (also referred to as aluminum nitride oxide) (AlNO), aluminum oxide, diamond-like carbon (DLC), polysilazane, nitrogen-containing carbon (CN), phosphosilicate glass (PSG), borophosphosilicate glass (BPSG), alumina, or other substances containing an inorganic insulating material. In addition, a siloxane resin may also be used. Further, an organic insulating material may be used. Furthermore, resist, a photosensitive or non-photosensitive organic material such as polyimide, acrylic, polyamide, polyimide amide, or benzocyclobutene can also be used. In addition, an oxazole resin can also be used, and for example, a photo-curable polybenzoxazole or the like can be used.

The passivation film may be formed using an insulating film including silicon nitride, silicon oxide, silicon oxynitride, silicon nitride oxide, aluminum nitride, aluminum oxynitride, aluminum nitride oxide containing more nitrogen than oxygen, aluminum oxide, diamond-like carbon (DLC), or nitrogen-containing carbon, and a single layer or a stacked layer of the insulating films can be used. Alternatively, a siloxane resin may also be used.

In this embodiment mode, the passivation layer 811 is provided with a selective reflection structure 827 in which a PBS array 814 and a quarter-wave retardation plate 813 are combined, which is described in Embodiment Mode 1, with an adhesive layer 812 interposed between the passivation layer 811 and the selective reflection structure 827.

Since uniformity of the cell gap in the pixel portion 803 is important in the liquid crystal panel, planarity is necessary particularly in this display region on the counter substrate side. Therefore, a planarizing film 815 is formed on the selective reflection structure 827 in which the PBS array 814 and the quarter-wave retardation plate 813 are combined.

Furthermore, as a structure of a liquid crystal panel capable of color display in this embodiment mode, a black matrix (hereinafter, BM) 816, a color filter 817, and an overcoat 818 are sequentially formed on the planarizing film 815. Here, the overcoat 818 serves to prevent a diffusing material from the BM 816 and the color filter 817 from adversely affecting liquid crystal or an element on the element substrate, as well as serving as a planarizing effect. A light-transmitting conductive film to serve as the opposite electrode 819 of liquid crystal is formed on this overcoat 818.

On the other hand, the pixel portion 803 is formed using a pixel TFT 821, an auxiliary capacitor 822, and a pixel electrode 823 using a light-transmitting conductive film over the element substrate 800. The source driver circuit 805 is formed using a thin film transistor using a circuit TFT 824 or the like.

Similarly, although not shown in this cross-sectional view, the gate driver circuit 804 is also formed using a thin film transistor or the like. The source driver circuit 805 and the gate driver circuit 804 are connected to the FPC 806 through a terminal lead wire 825 of a terminal portion 826, and various power supplies or signals are applied.

Although not shown in the cross-sectional view in this embodiment mode, lead-out portions of the first electrode 808 and the second electrode 810 are provided inside the counter substrate 801 at the time of forming a panel. Therefore, application of power supply to these electrodes may be performed by electrically connecting the wiring of the element substrate 800 and the terminal lead wire to each other through a conductive spacer, a conductive paste, or the like; or by directly providing a power supply wiring on the inside surface of the counter substrate 801 by increasing the outer shape of the counter substrate 801.

As an effect of this embodiment mode, by using a surface light source, particularly, a scattering optical system or the like is not necessary, and emission light having less luminance variation can be used. In addition, since light can be emitted from a plane, the surface light source can be disposed on a parallel plane at a distance very close to the selective reflection structure, and a structure integrally provided with a light source without including an air layer can be formed. Therefore, refractive index difference can be reduced, and a structure having less loss at the interface can be formed. With these features, an operation in which ineffective light reflected can also be converted and extracted as well as a single polarization component is realized; accordingly, a polarizing light source having higher light-use efficiency can be formed.

Furthermore, one substrate can be provided with these functions; therefore, the substrate can be used not only as a light source of a backlight of liquid crystal but also as a counter substrate of the liquid crystal directly, and a liquid crystal panel incorporating a backlight can be realized.

With these effects, a thin liquid crystal panel with low power consumption can be realized.

Embodiment Mode 6

This embodiment mode will describe another example in which the present invention is used for an active matrix liquid crystal panel having a display function, with reference to FIGS. 10A and 10B. In this embodiment mode, the structure described in Embodiment Mode 4 is used for a counter substrate of the liquid crystal panel.

FIG. 10A is a schematic view of an active matrix liquid crystal panel when seen from the top. A counter substrate 901 is firmly fixed to an element substrate 900 with a sealant 902.

The element substrate 900 is provided with a pixel portion 903, a gate driver circuit 904, and a source driver circuit 905. Each of the gate driver circuit 904 and the source driver circuit 905 is connected to an FPC (Flexible Printed Circuit) 906 which is an external input terminal, through a wiring group. The source driver line 905 and the gate driver line 904 each receive a video signal, a clock signal, a start signal, a reset signal, various power supplies, or the like from the FPC 906.

Transistors in the pixel portion 903, and the gate driver circuit 904 and the source driver circuit 905 which are a driver circuit portion are thin film transistors (hereinafter, TFTs). Note that the gate driver circuit 904 and the source driver circuit 905 are not necessarily provided over the same element substrate 900 as the pixel portion 903, as in the example described above. For example, the gate driver circuit 904 and the source driver circuit 905 may be provided outside the substrate by using a TCP in which an IC chip is mounted on an FPC on which a wiring pattern is formed, or the like. In addition, a part of circuits in each of the gate driver circuit 904 and the source driver circuit 905 may be provided over the element substrate 900, and another part of them may be provided outside the element substrate 900.

FIG. 10B shows a cross-sectional view along a line A-A' of FIG. 10A. This counter substrate 901 is provided with a light source having a polarization function of the present invention, and a light-emission surface of effective light from this counter substrate and an element surface of the element substrate 900 are arranged so as to face each other while a predetermined space (hereinafter, a cell gap) is kept. Liquid crystal 907 is oriented inside the sealant 902 which firmly fixes the element substrate 900 and the counter substrate 901, and a panel provided with a light source is formed.

Although not shown here, orientation films which are subjected to orientation treatment are formed on surfaces having an opposite electrode 921 and a pixel electrode 925. In addition, a spacer 922 is formed over the element substrate in order to keep the cell gap here. Although not shown, a spacer material, called a filler may be mixed into the sealant 902. In this structure, light is extracted from the element substrate 900 side.

Here, a second electrode 908 using a light-transmitting conductive material, an insulating layer 909, an EL layer 910 to serve as a light-emitting portion, and a first electrode 911 using a reflective material are sequentially stacked over one side of the counter substrate 901. The insulating layer 909 is provided for avoiding electrical short-circuit between the first electrode and the second electrode The first electrode 911 is provided with a passivation layer 912 for the purpose of preventing adverse effect caused by moisture or oxygen on the EL layer. In addition, a protective film 913 is provided over the passivation layer 912 for protecting the light source portion. The passivation layer 912 and the protective film 913 may be provided, if necessary.

In addition, on the other side of the counter substrate, a selective reflection structure 914 is formed at a position approximately corresponding to a region of a light-emission surface in which light of the light-emitting portion is extracted from the second electrode. Here, the selective reflection structure 914 is formed using a combination of a quarter-wave retardation plate 915 and a reflection polarization plate 916.

Since uniformity of the cell gap in the pixel portion 903 is important in the liquid crystal panel, planarity is necessary particularly in this display region on the counter substrate side. Therefore, a planarizing film 917 is formed on the selective reflection structure 914.

Furthermore, as a structure of a liquid crystal panel capable of color display in this embodiment mode, a black matrix (hereinafter, BM) 918, a color filter 919, and an overcoat 920 are sequentially formed on the planarizing film 917. Here, the overcoat 920 serves to prevent a diffusing material from the BM 918 and the color filter 919 from adversely affecting liquid crystal or an element on the element substrate, as well as serving as a planarizing effect. A light-transmitting conductive film to serve as the opposite electrode 921 of liquid crystal is formed on this overcoat 920.

On the other hand, the pixel portion 903 is formed using a pixel TFT 923, an auxiliary capacitor 924, and a pixel electrode 925 using a light-transmitting conductive film over the element substrate 900. The source driver circuit 905 is formed using a thin film transistor using a circuit TFT 926 or the like. Similarly, although not shown in this cross-sectional view, the gate driver circuit 904 is also formed using a thin film transistor or the like. The source driver circuit 905 and the gate driver circuit 904 are connected to the FPC 906 through a terminal lead wire 927 of a terminal portion 928, and various power supplies or signals are applied.

In this embodiment mode, at the time of forming a panel, a first electrode lead-out portion 929 which is electrically connected to the first electrode 911 and a second electrode lead-out portion 930 which is electrically connected to the second electrode 908 are provided on an outer side of the counter substrate 901.

In general, the first electrode lead-out portion 929 is formed at the same time as the first electrode 911 is formed, and the second electrode lead-out portion 930 is formed at the same time as the second electrode 908 is formed.

The second electrode and the second electrode lead-out portion are formed using ITO, ZnO, or the like which is a light-transmitting conductive material; however, there are problems as follows: films formed using light-transmitting conductive materials have higher electrical resistance than that of a metal material; it is undesirable to treat these light-transmitting conductive films themselves in an exposed state in terms of reliability; and in the case of performing direct soldering or the like, special soldering equipment and a material are necessary, and the like.

In this embodiment mode, over the second electrode lead-out portion 930 which is formed in advance, a first electrode formation film using a metal material such as aluminum or an aluminum alloy is stacked so as to be electrically separated from the first electrode at the same time as the first electrode 911 is formed. Thus, resistance of the second electrode lead-out portion of the second electrode is reduced, and reliability is improved.

When a display surface of the liquid panel is a front face, a back side of the panel is provided with a power supply connection portion.

Embodiment Modes 1 to 6 describe structural examples in which extraction efficiency of light emitted from the lighting device (light source) can be improved at the same time as light polarized can be extracted; however, the selective reflection structure may be formed simply using a film having a similar operation to a polarization plate, or the like. Since an air layer is not provided between the light source and the polarization plate, optical loss at the interface therebetween can be improved.

Alternatively, on a light-emission side of effective light of a light source which is integrally provided as shown in Embodiment Modes 1 to 6, by providing another polarization plate (film) or the like, and aligning a transmission axis of the polarization plate and a polarization plane of emission light such that emission light can pass through the polarization plane of emission light, a polarizing light source having better extinction ratio can be provided. Thus, the contrast or the like of a liquid crystal display device or the like can be improved.

Note that this embodiment mode describes the active matrix liquid crystal panel; however, this embodiment mode can be used for a passive matrix liquid crystal panel.

In addition, it is preferable that areas of the EL layers 809 and 910 to serve as the light-emitting portions of the light sources be slightly larger than areas of the pixel portions 803 and 903 described in Embodiment Modes 5 and 6 respectively. However, increasing the sizes of these light-emitting portions themselves can lead to an increase of power consumption. Furthermore, it is not preferable that the thin film transistors such as the circuit TFTs 824 and 926 which form the source driver circuits 805 and 905 and the gate driver circuits 804 and 904 respectively be irradiated with ineffective light in consideration of an effect of light leakage. The present invention also has a feature that the region of the light-emitting portion can be selectively provided in accordance with each panel shape. Namely, the EL layer may be selectively provided so as to overlap with a pixel region.

As an effect of this embodiment mode, by using a surface light source, particularly, a scattering optical system or the like is not necessary, and emission light having less luminance variation can be used. In addition, since light can be emitted from a plane, the surface light source can be disposed on a parallel plane at a distance very close to the selective reflection structure, and a structure integrally provided with a light source without including an air layer can be formed. Therefore, refractive index difference can be reduced, and a structure having less loss at the interface can be formed. With these features, an operation in which ineffective light reflected can also be converted and extracted as well as a single polarization component is realized; accordingly, a polarizing light source having higher light-use efficiency can be formed.

Furthermore, one substrate can be provided with these functions; therefore, the substrate can be used not only as a light source of a backlight of liquid crystal but also as a counter substrate of the liquid crystal directly, and a liquid crystal panel incorporating a backlight can be realized.

With these effects, a thin liquid crystal panel with low power consumption can be realized.

Embodiment Mode 7

A display device of the present invention can be used as a display portion of an electronic device.

The electronic device described in this embodiment mode has any of the display device described in Embodiment Modes 1 to 5. By using a polarizing light source whose extraction efficiency of light is improved, low consumption power can be realized. In addition, this light source is provided on a counter substrate and a liquid crystal panel is integrally provided with this light source, so that the thickness of the panel and a space which has been necessary so far for a light source (lighting device) can be reduced. A thin space-saving liquid crystal display device which consumes less power, or the like can be realized.

As an electronic device of the present invention, a video camera, a digital camera, a goggle type display, a navigation system, an audio reproducing device (car audio set, audio component set, or the like), a computer, a game machine, a portable information terminal (mobile computer, mobile phone, portable game machine, an e-book reader, or the like), and an image reproducing device provided with a recording medium (specifically, a device provided with a display device that can reproduce a recording medium such as a digital versatile disc (DVD) and display the image), and the like are given. Specific examples of these electronic devices are shown in FIGS. 11A to 11D.

Figure 11A:
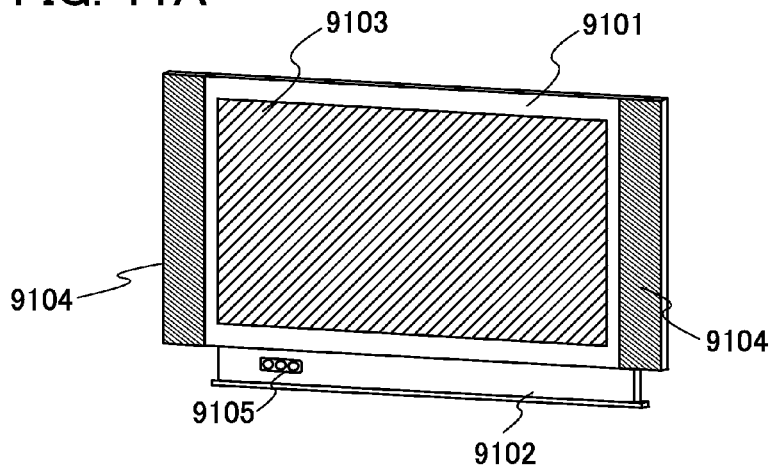
FIGS. 11A to 11D are views illustrating electronic devices of the present invention.

FIG. 11A shows a television device according to the present invention, which includes a chassis 9101, a supporting base 9102, a display portion 9103, a speaker portion 9104, a video input terminal 9105, and the like. In the television device, the display device of the present invention can be used as the display portion 9103. By using a polarizing light source whose extraction efficiency of light is improved, power consumption of the main body of the television device can be reduced. Therefore, a product suitable for a living environment can be provided.

Figure 11B:
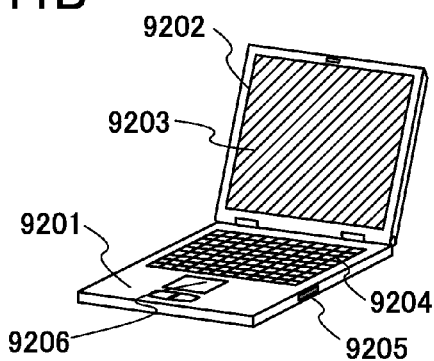

FIG. 11B shows a computer according to the present invention, which includes a main body 9201, a chassis 9202, a display portion 9203, a keyboard 9204, an external connection port 9205, a pointing device 9206, and the like. In this computer, the display device of the present invention can be used as the display portion 9203. By using a polarizing light source whose extraction efficiency of light is improved, power consumption of the computer itself can be reduced.

Figure 11C:
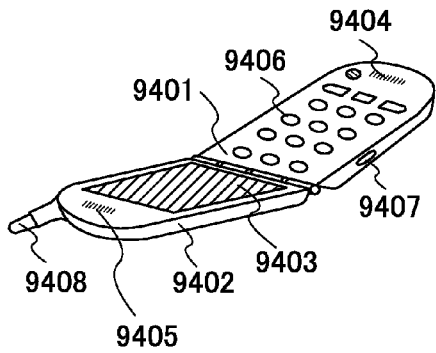

FIG. 11C shows a mobile phone which includes a main body 9401, a chassis 9402, a display portion 9403, an audio input portion 9404, an audio output portion 9405, an operation key 9406, an external connection port 9407, an antenna 9408, and the like. In the mobile phone, the display device of the present invention can be used as the display portion 9403. By using a polarizing light source whose extraction efficiency of light is improved, power consumption of the mobile phone can be reduced to improve convenience.

Figure 11D:
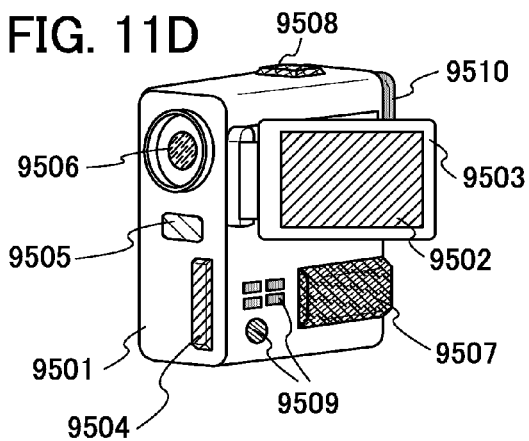

FIG. 11D shows a camera which includes a main body 9501, a display portion 9502, a chassis 9503, an external connection port 9504, a remote control receiving portion 9505, an image receiving portion 9506, a battery 9507, an audio input portion 9508, an operation key 9509, an eye piece portion 9510, and the like. In the camera, the display device of the present invention can be used as the display portion 9502. By using a polarizing light source whose extraction efficiency of light is improved, power consumption of the main body of the camera can be reduced to improve convenience.

As described above, the applicable range of the display device of the present invention is so wide that the display device is applicable to electronic devices in various fields. By applying the present invention, a thin space-saving electronic device which consumes less power can be manufactured.

Embodiment Mode 8

The display device of the present invention can also be used as a lighting device. One mode of using the display device of the present invention as the lighting device will be described with reference to FIGS. 12A to 14.

Figure 12A:
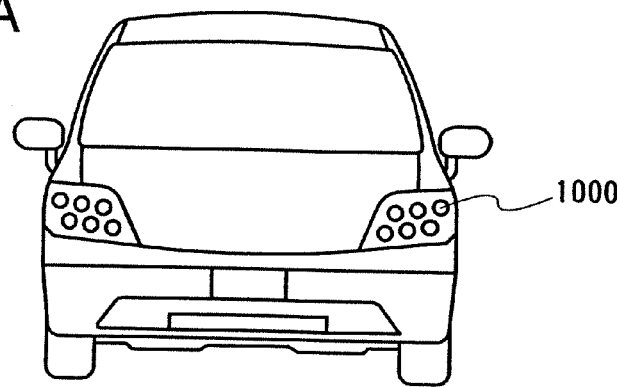
FIGS. 12A to 12C are diagrams illustrating a lighting device of the present invention.
Figure 12B:
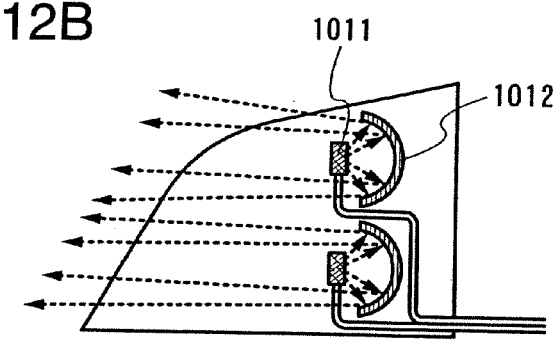
Figure 12C:
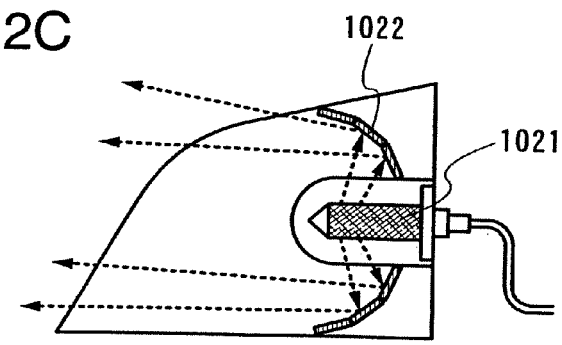

The display device can be used as a headlight of an automobile, a bicycle, a ship, or the like. FIGS. 12A to 12C each show an example in which the display device of the present invention is used as a headlight of an automobile. FIG. 12B is a cross-sectional view in which a portion of a headlight 1000 in FIG. 12A is enlarged. In FIG. 12B, a display device of the present invention is used as a light source 1011. Light emitted from the light source 1011 is reflected by a reflecting plate 1012 to be extracted to outside. With the use of a plurality of light sources as shown in FIG. 12B, light with higher luminance can be obtained. FIG. 12C shows an example in which the display device of the present invention manufactured in a cylindrical shape is used as a light source. Light emitted from a light source 1021 is reflected by a reflecting plate 1022 to be extracted to outside.

Figure 13:
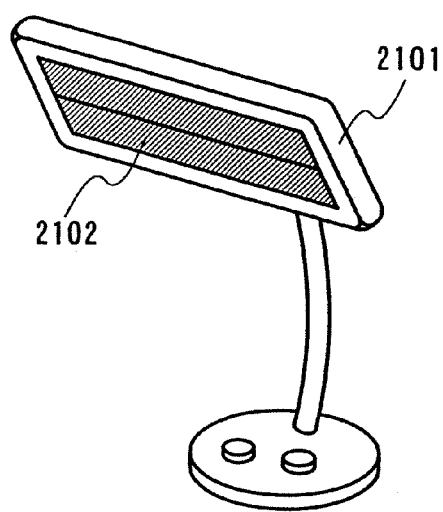
FIG. 13 is a diagram illustrating a lighting device of the present invention.

FIG. 13 shows an example in which the display device of the present invention is used as a desk lamp, which is a lighting device. A desk lamp shown in FIG. 13 has a chassis 2101 and a light source 2102, and the display device of the present invention is used as the light source 2102. The display device of the present invention is thin and space-saving; therefore, the degree of freedom for location is high in a room.

Figure 14:
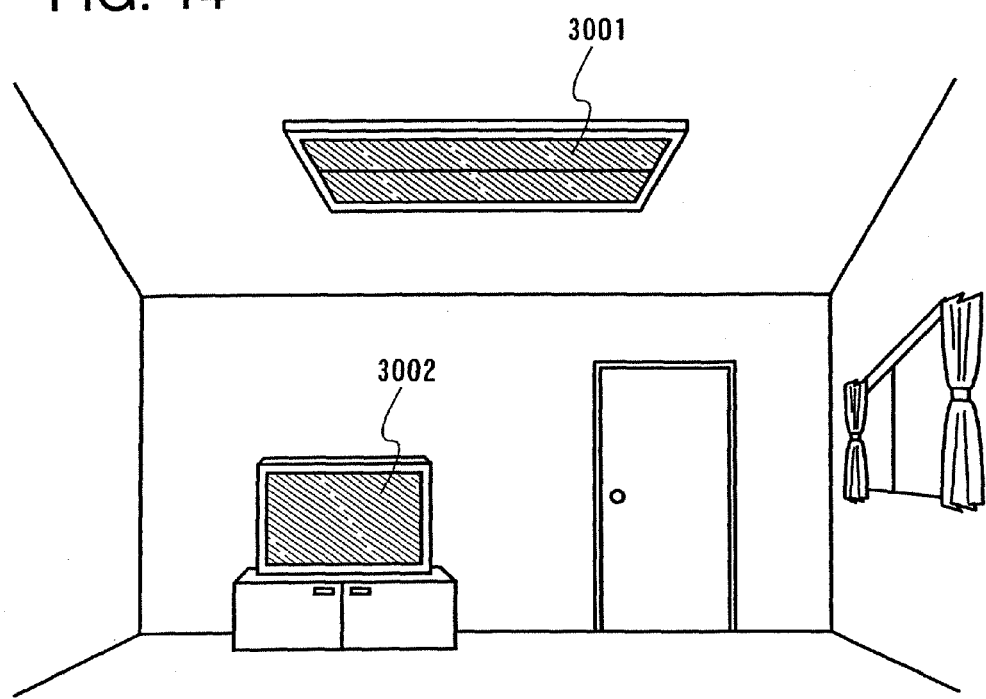
FIG. 14 is a diagram illustrating a lighting device of the present invention.

FIG. 14 shows an example in which the display device of the present invention is used as an indoor lighting device 3001. Since the display device of the present invention can have a large area, the display device of the present invention can be used as a lighting device having a large area. Further, the display device of the present invention is thin and consumes less power; therefore, the display device of the present invention can be used as a lighting device having a thin shape and consuming less power. A television device 3002 according to the present invention as described in FIG. 11A may be placed in a room in which the display device of the present invention is used as the indoor lighting device 3001 in such a manner. Thus, public broadcasting and movies can be watched. In such a case, since both of the devices consume less power, a powerful image can be watched in a bright room without concern about electricity charges.

A lighting device is not limited to those illustrated in FIGS. 12A to 12C, FIG. 13, and FIG. 14, and is applicable as a lighting device with various modes such as lighting for houses or public facilities. In such a case, since a light emitting medium having a thin film shape is used for the lighting device according to the present invention, the degree of freedom for design is high. Accordingly, various elaborately-designed products can be provided in the market.

In such a manner, by using the display device of the present invention, a thin space-saving electronic device which consumes less power can be provided. This embodiment mode can be freely combined with any of the embodiment modes.

This application is based on Japanese Patent Application serial No. 2006-155470 filed in Japan Patent Office on Jun. 2, 2006, the entire contents of which are hereby incorporated by reference.

What is claimed is:

1. A lighting device comprising:
   a substrate comprising a light-transmitting material;
   a second electrode comprising a light-transmitting material;
   an EL layer;
   a first electrode comprising a reflective material;
   a pair of polarization beam splitters; and
   a quarter-wave plate selectively provided between the substrate and only one of the pair of polarization beam splitters,
   wherein the second electrode, the EL layer, and the first electrode are sequentially stacked over a first side of the substrate,
   wherein the pair of polarization beam splitters is provided over a second side of the substrate opposite to the first side,
   wherein the pair of polarization beam splitters is configured to transmit light of a first polarization component from the EL layer while reflecting light of a second polarization component from the EL layer, the second polarization component being different from the first polarization component.

2. The lighting device according to claim 1, further comprising a protective film over the first electrode.

* * * * *